US008921922B2

(12) United States Patent
Kim et al.

(10) Patent No.: US 8,921,922 B2
(45) Date of Patent: Dec. 30, 2014

(54) NONVOLATILE MEMORY DEVICE AND METHOD FOR FABRICATING THE SAME

(71) Applicant: SK Hynix Inc., Gyeonggi-do (KR)

(72) Inventors: Min-Soo Kim, Gyeonggi-do (KR); Young-Jin Lee, Gyeonggi-do (KR); Sung-Jin Whang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 76 days.

(21) Appl. No.: 13/720,362

(22) Filed: Dec. 19, 2012

(65) Prior Publication Data

US 2014/0054674 A1 Feb. 27, 2014

(30) Foreign Application Priority Data

Aug. 21, 2012 (KR) .......................... 10-2012-0091109

(51) Int. Cl.
*H01L 29/792* (2006.01)
*H01L 29/66* (2006.01)
*G11C 16/04* (2006.01)
*H01L 27/115* (2006.01)

(52) U.S. Cl.
CPC ........ *H01L 29/792* (2013.01); *H01L 29/66833* (2013.01); *G11C 16/0483* (2013.01); *H01L 27/1157* (2013.01); *H01L 29/7926* (2013.01); *H01L 27/11582* (2013.01)
USPC ........... 257/324; 257/314; 257/315; 257/318; 257/E21.422; 438/268; 438/201; 438/212; 438/257

(58) Field of Classification Search
CPC .... G11C 16/0483; G11C 5/02; H01L 29/792; H01L 29/66833; H01L 27/11578; H01L 29/7926; H01L 29/66666; H01L 27/11565; H01L 27/1157; H01L 27/11582
USPC .................. 257/314, 318, 322, 324, E21.422, 257/E29.003; 438/268, 201, 212, 257
See application file for complete search history.

(56) References Cited

U.S. PATENT DOCUMENTS

| 8,169,016 | B2 * | 5/2012 | Higashi ........................ 257/314 |
| 8,178,919 | B2 * | 5/2012 | Fujiwara et al. .............. 257/324 |
| 8,274,108 | B2 * | 9/2012 | Katsumata et al. ........... 257/319 |
| 2004/0214394 | A1 * | 10/2004 | Shimizu ........................ 438/257 |
| 2011/0062510 | A1 * | 3/2011 | Joo ................................ 257/324 |
| 2011/0147834 | A1 * | 6/2011 | Taniguchi ..................... 257/330 |

FOREIGN PATENT DOCUMENTS

KR      100910524      7/2009
KR    1020110131795    12/2011

* cited by examiner

*Primary Examiner* — Thinh T Nguyen
(74) *Attorney, Agent, or Firm* — IP & T Group LLP (57) ABSTRACT

This technology relates to a nonvolatile memory device and a method for fabricating the same. The nonvolatile memory device may include a pipe connection gate electrode configured to have a lower part buried in a groove formed in a substrate, one or more pipe channel layers formed within the pipe connection gate electrode, pairs of main channel layers each coupled with the pipe channel layer and extended in a direction substantially perpendicular to the substrate; and a plurality of interlayer insulating layers and a plurality of cell gate electrodes alternately stacked along the main channel layers. In accordance with this technology, a lower part of the pipe connection gate electrode is buried in the substrate. Accordingly, electric resistance may be reduced because the pipe connection gate electrode may have an increased volume without a substantial increase of the height.

6 Claims, 12 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2012-0091109, filed on Aug. 21, 2012, which is incorporated herein by reference in its entirety.

BACKGROUND

1. Field

Exemplary embodiments of the present invention relate to a nonvolatile memory device and a method for fabricating the same, and more particularly, to a three-dimensional (3-D) structured nonvolatile memory device in which a plurality of memory cells are stacked in a vertical direction over a substrate and a method for fabricating the same.

2. Description of the Related Art

A nonvolatile memory device retains stored data although the power is not supplied. A variety of nonvolatile memory devices, such as flash memory, are being widely used.

As the improvement of the degree of integration of two-dimensional (2-D) structured nonvolatile memory devices with memory cells that are formed over a semiconductor substrate in the form of a single layer has reached the limit, there has been proposed a 3-D structured nonvolatile memory device in which a plurality of memory cells is formed along channel layers in a vertical direction over a semiconductor substrate. More particularly, the 3-D structured nonvolatile memory device is mainly divided into a structure having a straight-line type channel layer and a structure having a U-shaped channel layer.

In the structure having a U-shaped channel layer, a pipe connection transistor is used to couple memory cell strings. However, in there is a concern in that electric resistance may increase, because the gate electrode of the pipe connection transistor (hereinafter referred to as a pipe connection gate electrode) is mainly made of polysilicon. In particular, an increase in the height of the pipe connection gate electrode to reduce the electric resistance of the pipe connection gate electrode may be limited and may become ineffective in a subsequent process.

SUMMARY

Exemplary embodiments of the present invention are directed to a nonvolatile memory device having reduced electric resistance by burying a lower part of a pipe connection gate electrode in a substrate to increase the volume of the pipe connection gate electrode without a substantial increase of the height and a method for fabricating the same.

In accordance with an embodiment of the present invention, a nonvolatile memory device may include a pipe connection gate electrode configured to have a lower part buried in a groove formed in a substrate, one or more pipe channel layers formed within the pipe connection gate electrode, pairs of main channel layers each coupled with the pipe channel layer and extended in a direction substantially perpendicular to the substrate, and a plurality of interlayer insulating layers and a plurality of cell gate electrodes alternately stacked along the main channel layers.

In accordance with another embodiment of the present invention, a method for fabricating a nonvolatile memory device may include forming a groove by selectively etching a substrate, forming a conductive layer for a gate electrode, that has at least one or more sacrificial layer patterns over the substrate, so that the groove is filled with the conductive layer, and forming a pipe connection gate electrode by selectively etching the conductive layer for a gate electrode.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIGS. 1 to 17 are cross-sectional views illustrating a nonvolatile memory device and a method for fabricating the same in accordance with an embodiment of the present invention. In particular, FIG. 17 is a cross-sectional view illustrating the nonvolatile memory device in accordance with an embodiment of the present invention, and FIGS. 1 to 16 are cross-sectional views illustrating an example of intermediate processes for fabricating the nonvolatile memory device of FIG. 17.

Figure 1:
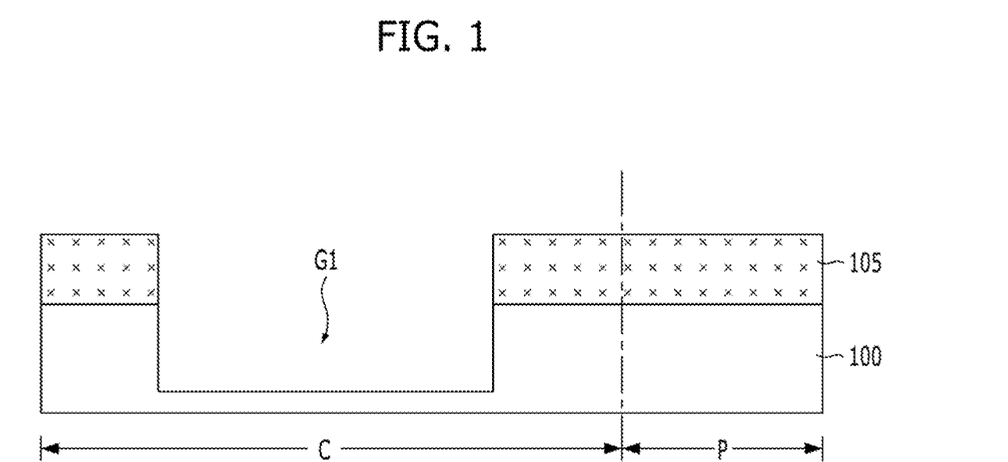
FIGS. 1 to 17 are cross-sectional views illustrating a nonvolatile memory device and a method for fabricating the same in accordance with an embodiment of the present invention.

Referring to FIG. 1, first hard mask patterns 105 through which a pipe connection gate electrode to be described later is exposed are formed over a substrate 100 including a cell region C and a peripheral region P. A first groove G1 is formed by etching the substrate 100 of the cell region C using the first hard mask patterns 105 as an etch mask.

The substrate 100 may be a semiconductor substrate, such as single crystalline silicon, and the substrate 100 may include specific underlying structures (not shown). Furthermore, the first hard mask pattern 105 may include one or more selected from the group that includes an oxide-based or nitride-based material, polysilicon, an amorphous carbon layer (ACL), and a bottom anti-reflective coating (BARC) layer. In particular, the first groove G1 is a space in which the bottom of the pipe connection gate electrode will be buried and may be separated by a block.

Figure 2:
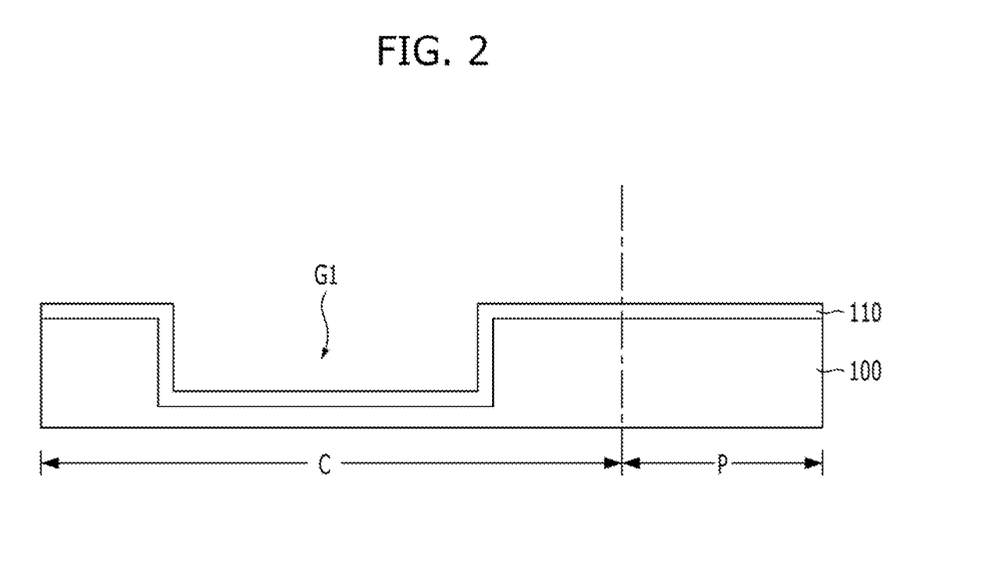

Referring to FIG. 2, after removing the first hard mask patterns 105, an isolation insulating layer 110 is formed over the substrate 100 in which the first groove G1 is formed. The isolation insulating layer 110 may be formed by depositing an oxide-based or nitride-based material conformably.

Figure 3:
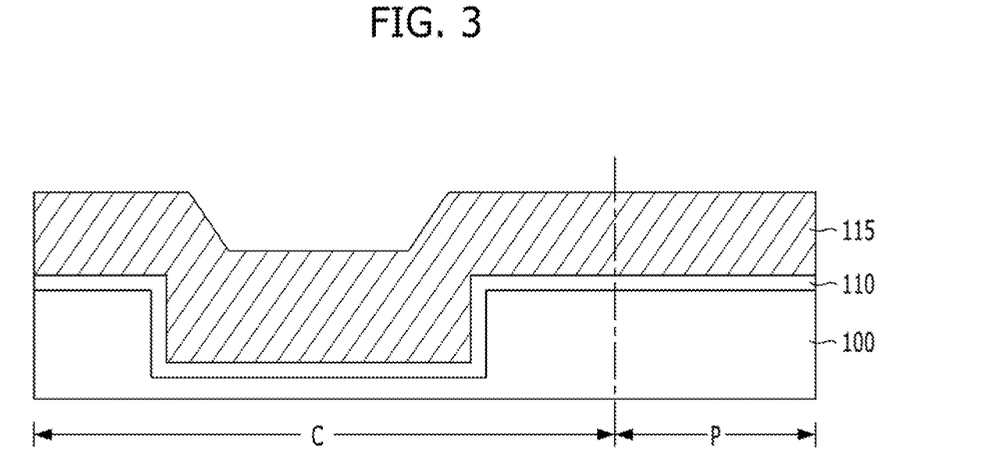

Referring to FIG. 3, a first conductive layer 115 for gate electrodes is formed on the isolation insulating layer 110. The first conductive layer 115 for gate electrodes may be formed by depositing a conductive material, such as doped polysilicon, to a thickness that fully fills the first groove G1 using an atomic layer deposition (ALD) or chemical vapor deposition (CVD) method.

Figure 4:
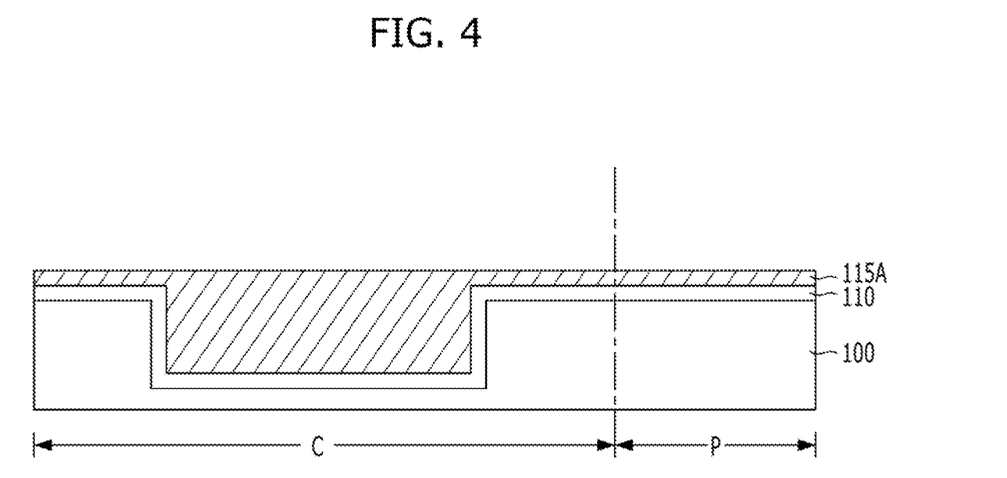

Referring to FIG. 4, a top surface of the first conductive layer 115 for gate electrodes is polished. In order to polish the top surface of the first conductive layer 115 for gate electrodes, a polishing process, such as chemical mechanical polishing (CMP), may be performed. The first conductive layer 115 having the polished top surface after the polishing is called a first conductive layer-primary pattern 115A.

Figure 5:
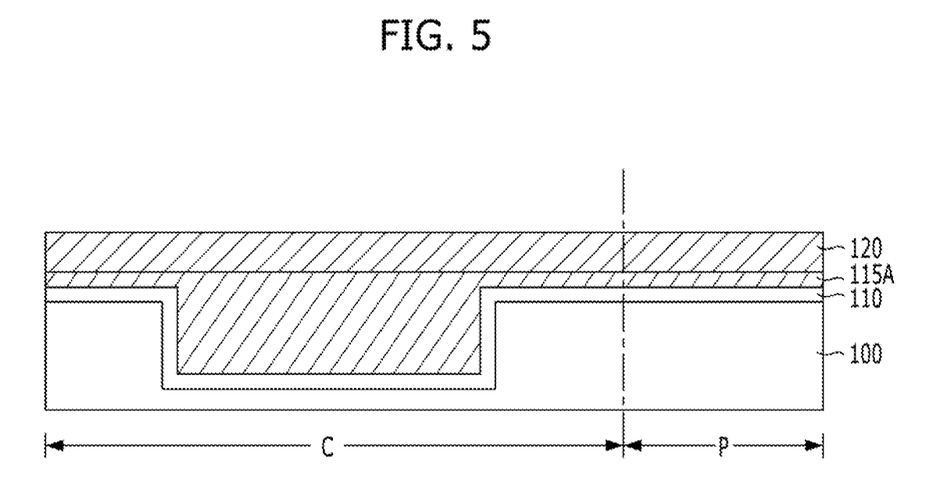

Referring to FIG. 5, a second conductive layer 120 for gate electrodes is formed on the first conductive layer-primary pattern 115A for gate electrodes. The second conductive layer 120 for gate electrodes may be formed by depositing a conductive material such as doped polysilicon, to a thickness thicker than a pipe channel layer to be described later using an ALD or CVD method.

Figure 6:
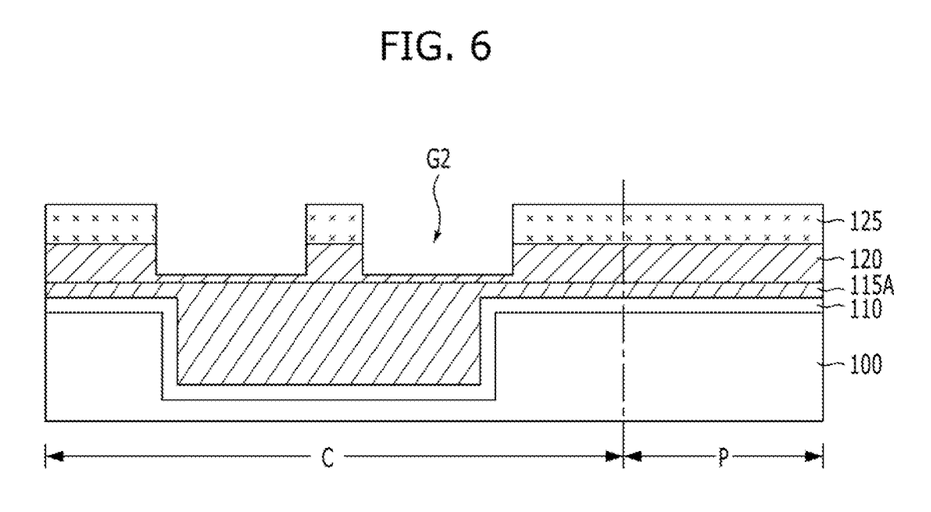

Referring to FIG. 6, second hard mask patterns 125 through which regions where sacrificial layer patterns will be formed are exposed are formed on the second conductive layer 120 for gate electrodes. Second grooves G2 are formed by etching the second conductive layer 120 for gate electrodes in the cell region C using the second hard mask patterns 125 as an etch mask. The second hard mask pattern 125 may include one or more selected from the group that includes an oxide-based or nitride-based material, polysilicon, an ACL, and a BARC layer.

Figure 7:
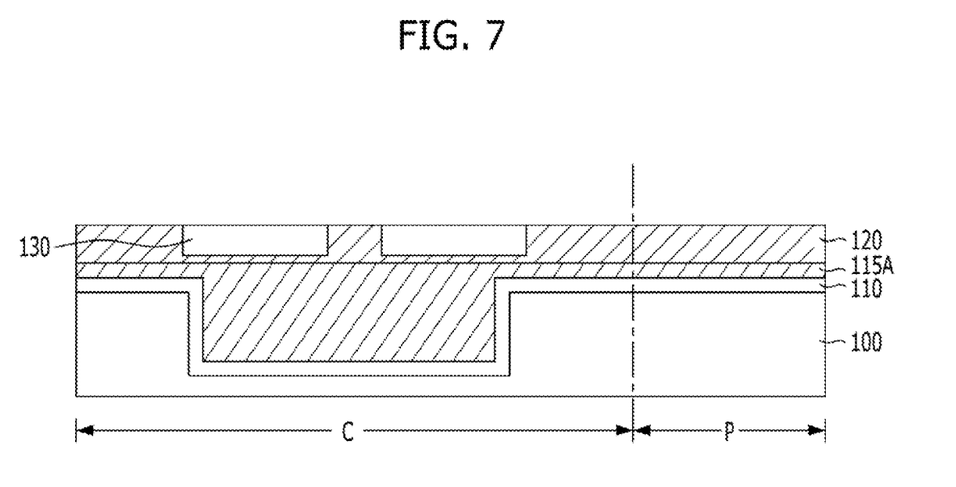

Referring to FIG. 7, after removing the second hard mask patterns 125, the sacrificial layer patterns 130 buried in the second grooves G2 are formed. The sacrificial layer patterns 130 are removed in a subsequent process, thus functioning to provide spaces where pipe channel holes will be formed. The sacrificial layer patterns 130 may include a material having an etch rate different from an etch rate of a third conductive layer for gate electrodes, first material layers, and second material layers, which will be explained later, and the second conductive layer 120 for gate electrodes. Furthermore, the sacrificial layer pattern 130 may have an island form that has a long axis in the direction of the cross section of FIG. 7 and a short axis in a direction crossing the cross section of FIG. 7. A plurality of the sacrificial layer patterns 130 may be arranged in a matrix form when viewed from a plane parallel to the substrate 100.

Figure 8:
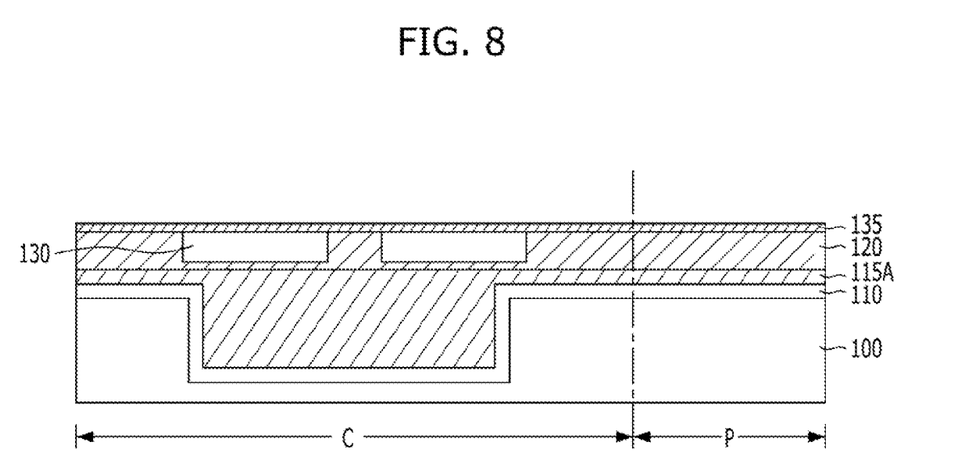

Referring to FIG. 8, a third conductive layer 135 for gate electrodes is formed on the second conductive layer 120 for gate electrodes and the sacrificial layer patterns 130. The third conductive layer 135 for gate electrodes may be formed by depositing a conductive material, such as doped polysilicon, using an ALD or CVD method.

Figure 9:
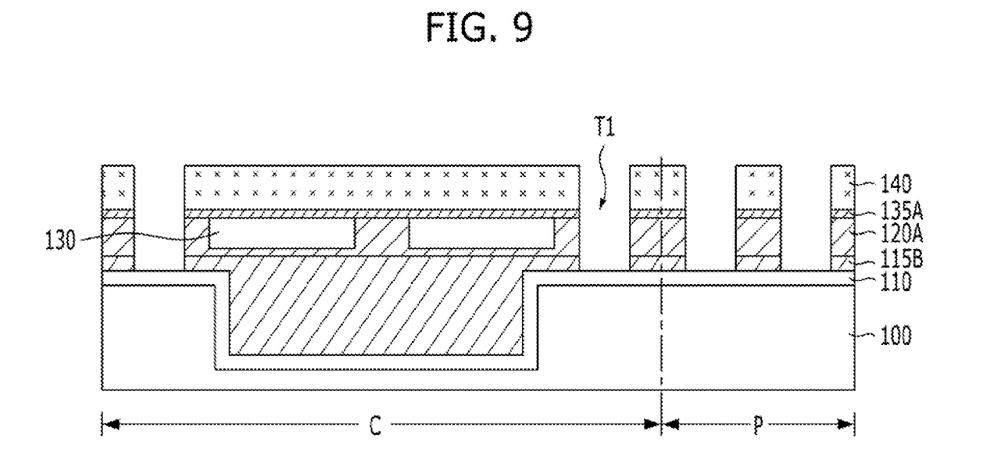

Referring to FIG. 9, third hard mask patterns 140 are formed on the third conductive layer 135 for gate electrodes and configured to cover regions where the pipe connection gate electrode and peripheral gate electrodes to be described later will be formed. Trenches T1 through which the isolation insulating layer 110 is exposed are formed by etching the third conductive layer 135, the second conductive layer 120, and the first conductive layer-primary pattern 115A using the third hard mask patterns 140 as an etch mask.

The third hard mask pattern 140 may include one or more selected from the group that includes an oxide-based or nitride-based material, polysilicon, an ACL, and a BARC layer. Meanwhile, the first conductive layer-primary patterns 115A, the second conductive layers 120, and the third conductive layers 135, which are separated by the trenches T1, are hereinafter referred to as first conductive layer-secondary patterns 115B for gate electrodes second conductive layer patterns 120A for gate electrodes, and third conductive layer patterns 135A for gate electrodes, respectively.

As a result of this process, the pipe connection gate electrode of the cell region C and the peripheral gate electrodes of the peripheral region P are formed. The pipe connection gate electrode and the peripheral gate electrodes have a form in which the first conductive layer-secondary patterns 115B, the second conductive layer patterns 120A, and the third conductive layer patterns 135A are sequentially stacked. In particular, the pipe connection gate electrode may be separated by a block.

Figure 10:
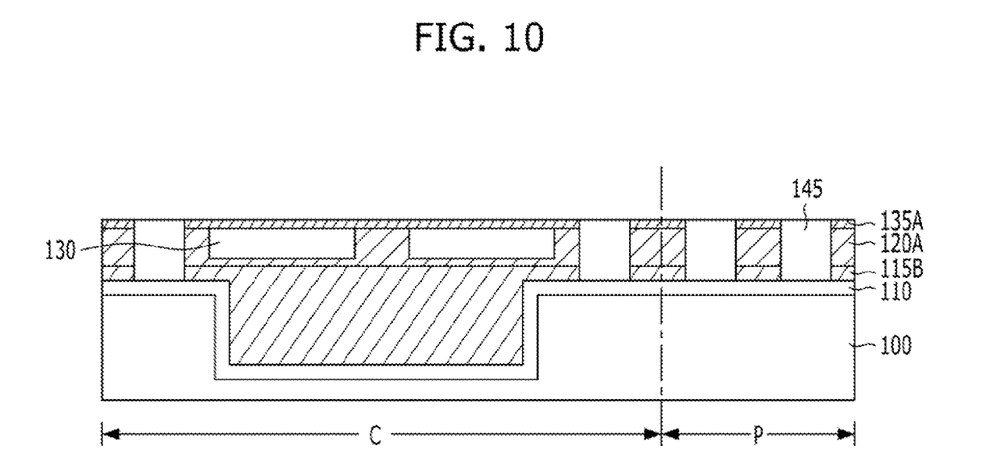

Referring to FIG. 10, after removing the third hard mask patterns 140, a first burial insulating layer 145 is formed within the trenches T1. The first burial insulating layer 145 may be formed by depositing an oxide-based or nitride-based material to a thickness that fills the trenches T1 and then performing a polishing process, such as chemical vapor deposition (CVD), until a top surface of the third conductive layer patterns 135A is exposed.

Figure 11:
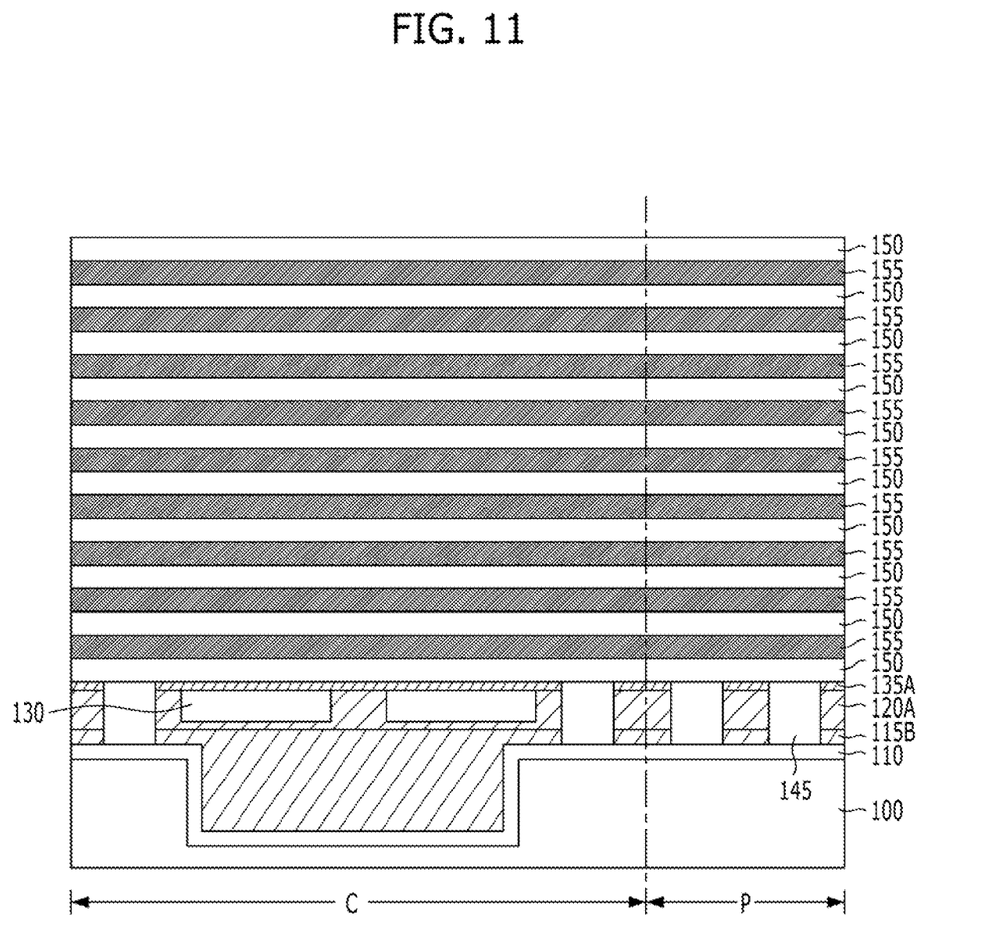

Referring to FIG. 11, a plurality of first material layers 150 and a plurality of second material layers 155 are alternately stacked over the third conductive layer patterns 135A and the first burial insulating layer 145. A structure in which the plurality of first material layers 150 and the plurality of second material layers 155 are alternately stacked is hereinafter referred to as a stack structure, for convenience of description. Meanwhile, the first material layers 150 may be disposed at the top and bottom of the stack structure. The cross section of FIG. 11 illustrates that the number of second material layers 155 is nine, but this is only illustrative. The number of second material layers 155 may be less than or greater than nine.

In the present embodiment, the first material layer 150 may be an interlayer insulating layer, and the second material layer 155 may be a sacrificial layer that is removed in a subsequent process, thus providing a space where a cell gate electrode will be formed. In this case, the first material layer 150 may include an oxide-based material, and the second material layer 155 may include a material having an etch rate different from an etch rate of the first material layer 150, for example, a nitride-based material.

However, the present invention is not limited to the above examples. In another embodiment, the first material layer 150 may be an interlayer insulating layer, and the second material layer 155 may be a conductive layer for a cell gate electrode. In this case, the first material layer 150 may include an oxide-based material, and the second material layer 155 may include a conductive material, such as polysilicon. In yet another embodiment, the first material layer 150 may be a sacrificial layer that provides a space where an interlayer insulating layer will be formed, and the second material layer 155 may be a conductive layer for a cell gate electrode. In this case, the first material layer 150 may include undoped polysilicon, and the second material layer 155 may include a conductive material such as doped polysilicon.

Figure 12:
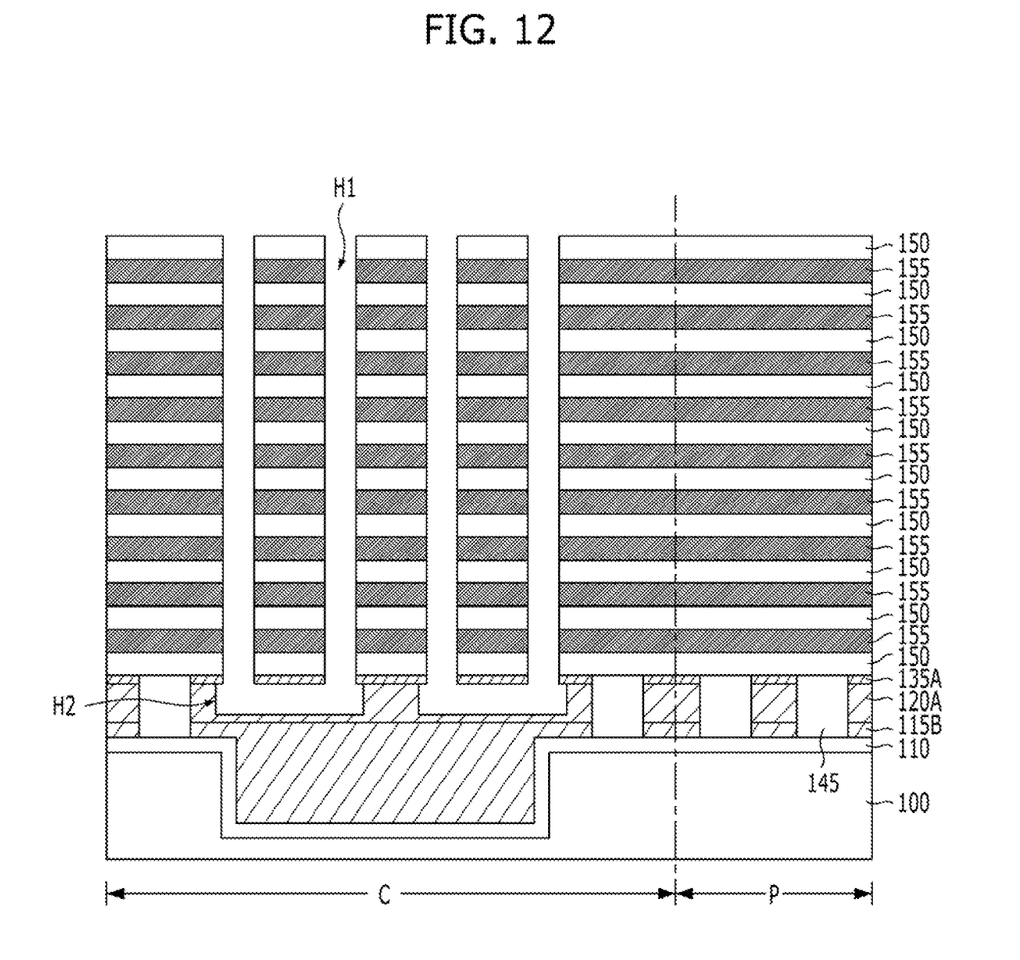

Referring to FIG. 12, pairs of main channel holes H1 through which the sacrificial layer patterns 130 are exposed are formed by selectively etching the stack structure and the third conductive layer patterns 135A. Each of the main channel holes H1 may have a circular or oval shape when viewed from a plane parallel to the substrate 100, and each of the pairs of main channel holes H1 may be placed in each of the sacrificial layer patterns 130.

The sacrificial layer patterns 130 exposed through the pairs of main channel holes H1 are removed. In order to remove the sacrificial layer patterns 130, a wet etch process using an etch selectivity with the pipe connection gate electrode and the stack structure may be performed. As a result of this process, pipe channel holes H2 each coupling a pair of the main channel holes H1 are formed in the respective spaces from which the sacrificial layer patterns 130 are removed.

Figure 13:
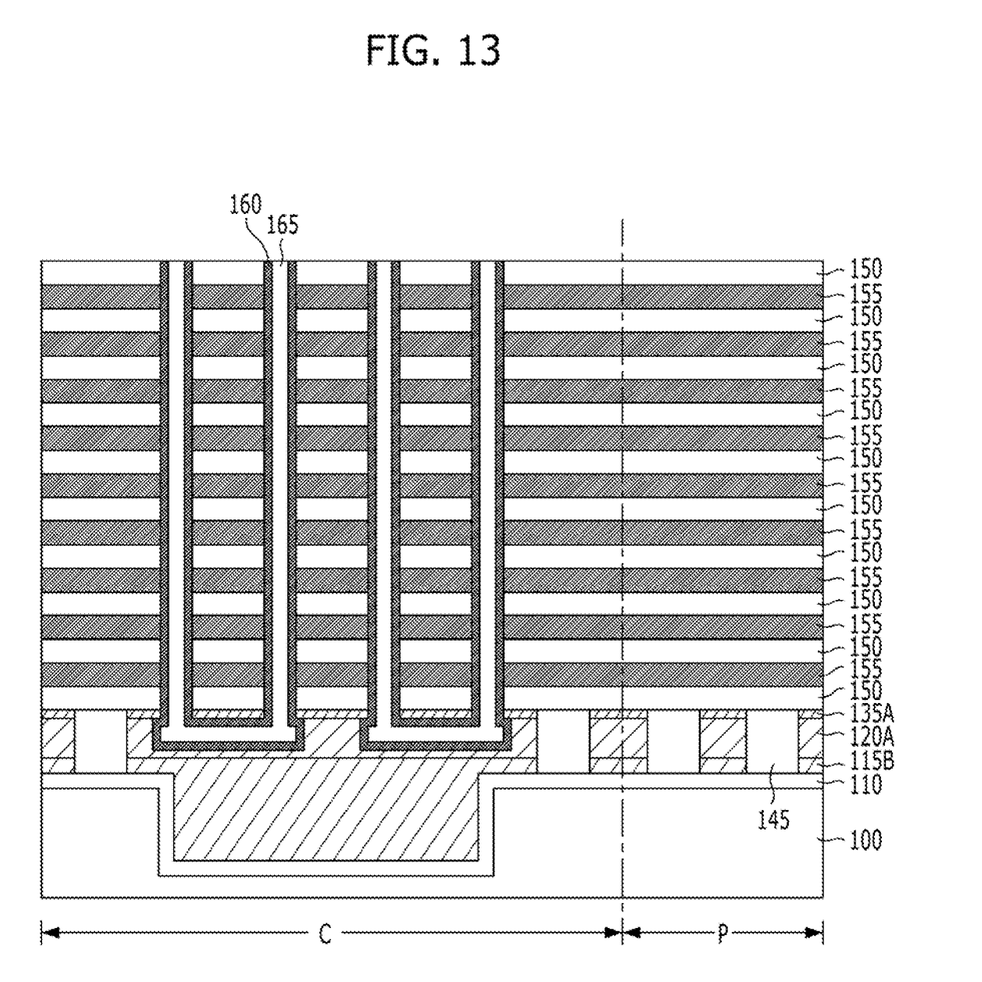

Referring to FIG. 13, a memory layer 160 and a channel layer 165 are sequentially formed on the inner walls of the pairs of main channel holes H1 and the pipe channel holes H2. The memory layer 160 may be formed by depositing a charge blocking layer, a charge trap layer, and a tunnel insulating layer sequentially.

The tunnel insulating layer is for charge tunneling and may include an oxide layer, for example. The charge trap layer functions to store data by trapping charges, and the charge trap layer may include a nitride layer, for example. The charge blocking layer functions to preclude charges within the charge trap layer from moving externally. The charge blocking layer may include an oxide layer, for example. That is, the memory layer 160 may have a triple structure of Oxide-Nitride-Oxide (ONO) layers.

Furthermore, the channel layer 165 may be formed by depositing a semiconductor material, such as polysilicon, and may be divided into a main channel layer within the main channel hole H1 and a pipe channel layer within the pipe channel hole H2. In particular, the main channel layer may be used as the channel of a memory cell or a select transistor, and the pipe channel layer may be used as the channel of a pipe connection transistor. Meanwhile, in the present embodiment, the channel layer 165 is illustrated as being formed to a thickness that fully fills the main channel holes H1 and the pipe channel holes H2, but the present invention is not limited thereto. In another embodiment, the channel layer 165 may be formed to a thickness that does not fully fill the main channel holes H1 and the pipe channel holes H2.

Figure 14:
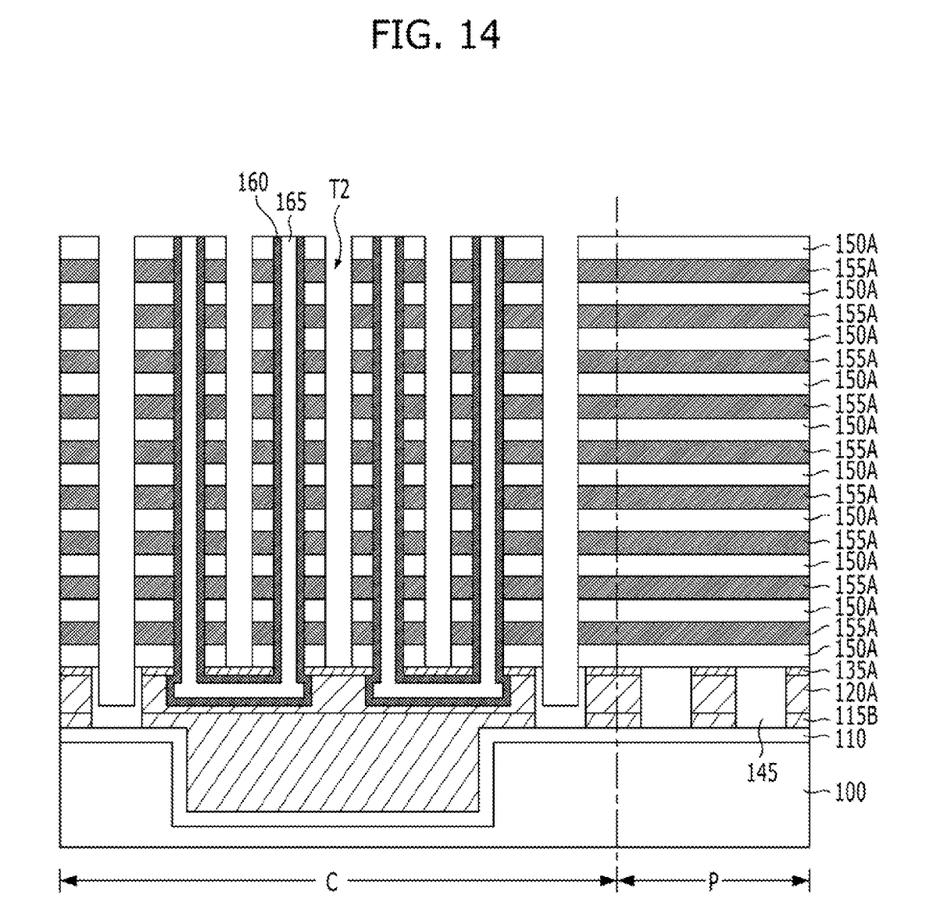

Referring to FIG. 14, slits T2 are formed by selectively etching the stack structure on both sides of each of the main channel holes H1. Each of the slits T2 separates the first material layers 150 and the second material layers 155 of the cell region C in a line form. The slits T2 may be extended in a direction crossing the cross section of FIG. 14 and, a plurality of the slits T2 may be arranged in parallel. Meanwhile, as a result of this process, part of the first burial insulating layers 145 may be etched, and the separated first material layers 150 and the separated second material layers 155 are referred to as first material layer patterns 150A and second material layer patterns 155A, respectively.

Figure 15:
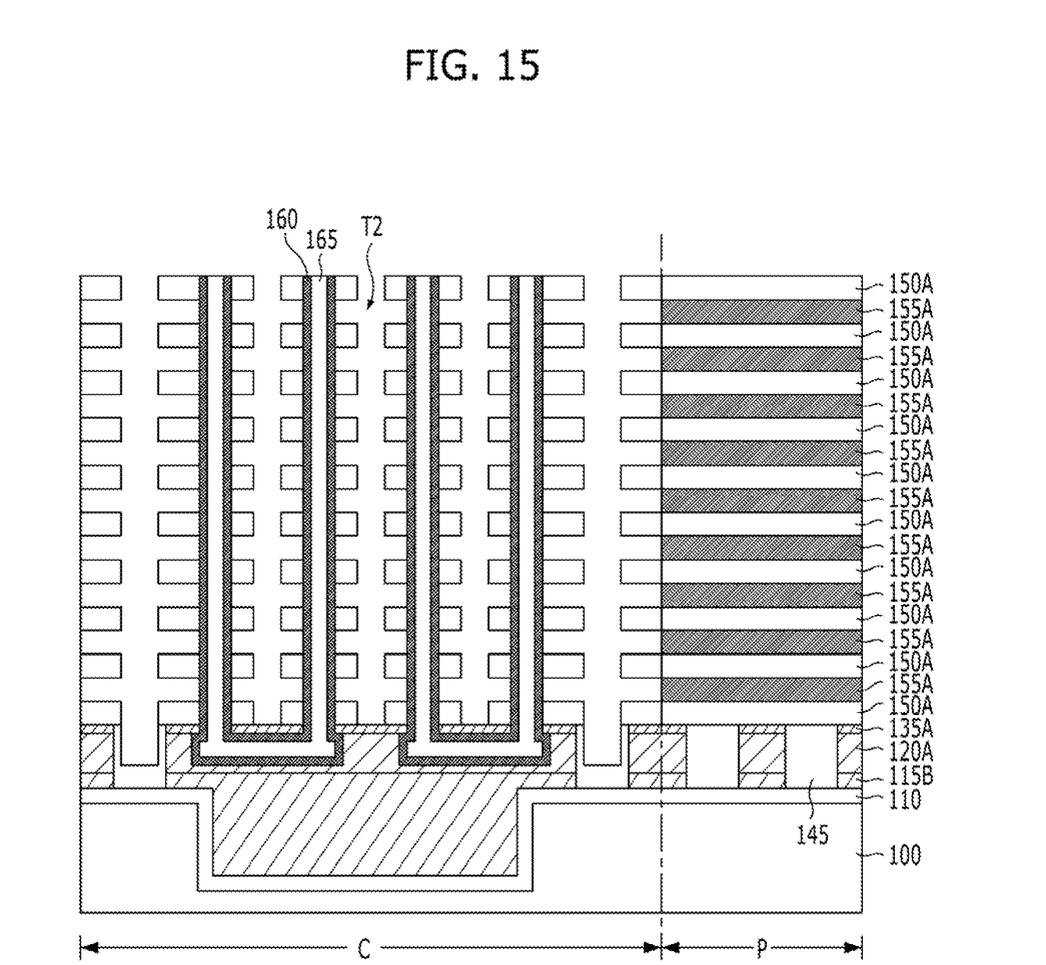

Referring to FIG. 15, the second material layer patterns 155A of the cell region C exposed by the formation of the slits T2 are removed. In order to remove the second material layer patterns 155A, a wet etch process using an etch selectivity with the first material layer patterns 150A may be performed.

Figure 16:
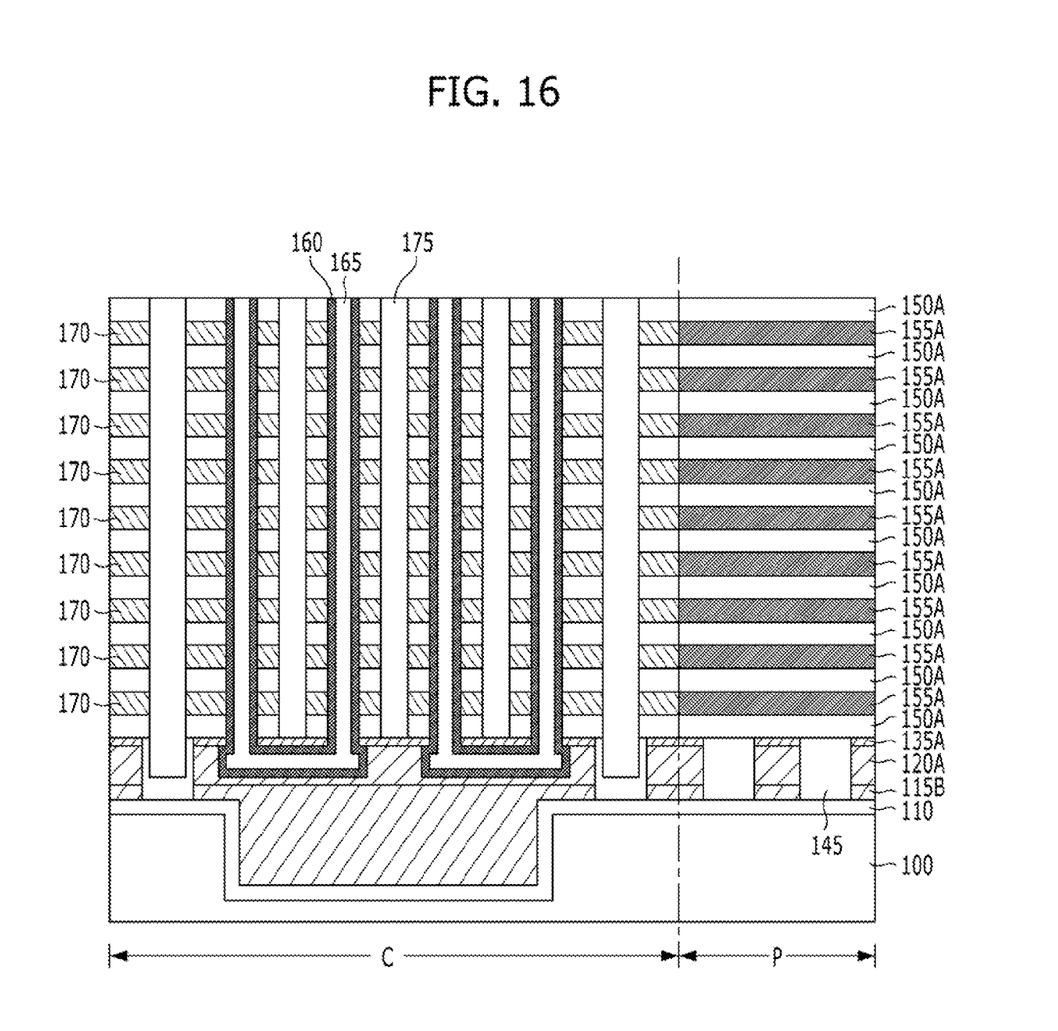
Figure 17:
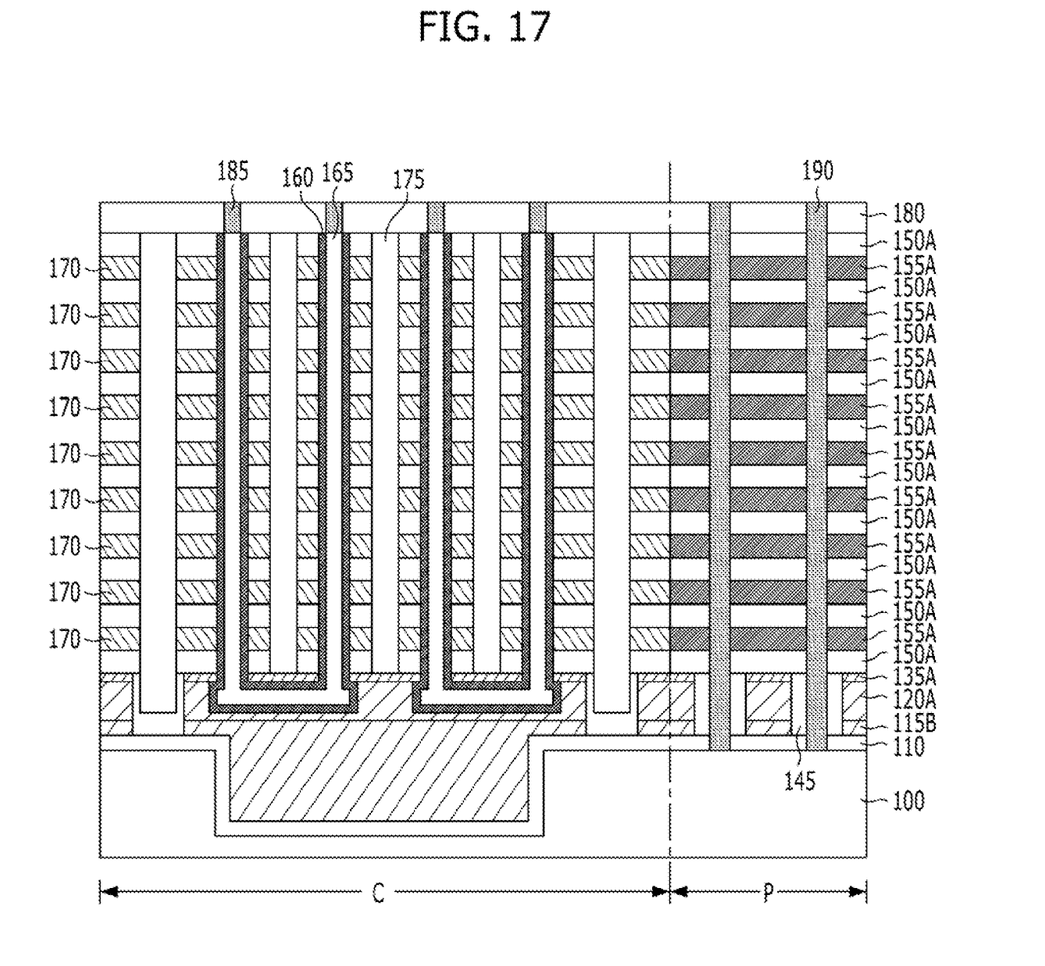

Referring to FIG. 16, cell gate electrodes 170 are formed in the spaces from which the second material layer patterns 155A are removed. The cell gate electrodes 170 may be formed by the following process.

First, a conductive layer (not shown) for the cell gate electrodes is formed to a thickness that fills the spaces from which the second material layer patterns 155A are removed by conformably depositing a conductive material, such as metal or metal nitride, using an ALD or CVD method. Next, the conductive layer for the cell gate electrodes is etched until the sides of the first material layer patterns 150A are exposed, which leads to the result that the conductive layer is separated for each layer and the cell gate electrode 170 is formed between the first material layer patterns 150A.

Next, second burial insulating layers 175 are formed within the slits T2. The second burial insulating layers 175 may be formed by depositing an oxide-based or nitride-based material to a thickness that fills the slits T2 and then performing a polishing process, such as CMP, until a top surface of the first material layer patterns 150A is exposed.

Referring to FIG. 17, a second interlayer insulating layer 180 is formed on the space in which the second burial insulating layers 175 are formed. The second interlayer insulating layer 180 may be formed by depositing an oxide-based or nitride-based material.

First contact plugs 185, which are coupled with the respective channel layers 165 in the cell region C, configured to penetrate the second interlayer insulating layer 180 are formed. Second contact plugs 190, which are coupled with the junction (not shown) of the substrate 100 in the peripheral region P, configured to penetrate the second interlayer insulating layer 180, the stack structure, the first burial insulating layer 145, and the isolation insulating layer 110 are formed. The first and the second contact plugs 185 and 190 may include a conductive material, such as doped polysilicon, metal, or metal nitride.

In accordance with the above-described fabrication method, the nonvolatile memory device in accordance with the embodiment of the present invention, such as that shown in FIG. 17, may be fabricated.

Referring to FIG. 17, the nonvolatile memory device in accordance with the embodiment of the present invention includes the pipe connection gate electrode configured to have a bottom buried in the groove that is formed in the substrate 100 including the cell region C and the peripheral region P, the channel layers 165 each configured to include one or more pipe channel layers formed within the pipe connection gate electrode and a pair of the main channel layers coupled to the pipe channel layer and extended in a direction substantially perpendicular to the substrate 100, the plurality of first material layer patterns 150A and the plurality of cell gate electrodes 170 alternately stacked along the main channel layers, the memory layer 160 interposed between the cell gate electrodes 170, the pipe connection gate electrode, and the channel layer 165, the first contact plugs 185 each coupled to the top of the channel layer 165, the isolation insulating layers 110 interposed between the peripheral gate electrodes over the substrate 100 of the peripheral region P, the pipe connection gate electrode, the peripheral gate electrodes, and the substrate 100, and the second contact plugs 190 connected with the substrate 100 on both sides of the peripheral gate electrodes.

The pipe connection gate electrode is separated on a block basis and configured to include the first conductive layer-secondary pattern 115B for gate electrodes protruded toward the substrate 100, the second conductive layer pattern 120A for gate electrodes configured to have the pipe channel layers, and the third conductive layer patterns 135A for gate electrodes formed over the first conductive layer-secondary pattern 115B and the second conductive layer pattern 120A in the cell region C. Furthermore, the peripheral gate electrode may have a form in which the first conductive layer-secondary pattern 115B, the second conductive layer pattern 120A, and the third conductive layer pattern 135A are sequentially stacked.

Meanwhile, the channel layer 165 may have a U shape, and the memory layer 160 may surround the channel layer 165. Furthermore, the cell gate electrodes 170 may surround the sides of the main channel layers and extend in a direction crossing the cross section of FIG. 17. In particular, a lower part of the pipe connection gate electrode other than a region separated on a block basis is protruded toward the substrate 100. Accordingly, the pipe connection gate electrode may have a sufficient volume without a substantial increase of the height.

In accordance with the nonvolatile memory device and the method for fabricating the same in accordance with the embodiments of the present invention, a lower part of the pipe connection gate electrode is buried in the substrate. Accordingly, electric resistance may be reduced because the pipe connection gate electrode may have an increased volume without a substantial increase of the height.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device, comprising:
    a pipe connection gate electrode configured to have a lower part buried in a groove formed in a substrate;
    one or more pipe channel layers formed within the pipe connection gate electrode;
    pairs of main channel layers each coupled with the pipe channel layer and extended in a direction substantially perpendicular to the substrate; and
    a plurality of interlayer insulating layers and a plurality of cell gate electrodes alternately stacked along the main channel layers,
    wherein the pipe connection gate electrode comprises a first conductive layer over the substrate, a second conductive layer over the first conductive layer, and a third conductive layer over the second conductive layer.

2. The nonvolatile memory device of claim 1,
    wherein the first conductive layer protrudes toward the substrate, and
    wherein the pipe channel layers are formed within the second conductive layer.

3. The nonvolatile memory device of claim 1, wherein the pipe connection gate electrode is separated by a block.

4. The nonvolatile memory device of claim 1, further comprising an insulating layer interposed between the pipe channel layers and the pipe connection gate electrode.

5. The nonvolatile memory device of claim 1, further comprising a memory layer interposed between each of the main channel layers and the cell gate electrodes.

6. The nonvolatile memory device of claim 1, further comprising isolation insulating layers interposed between the substrate and the pipe connection gate electrode.

* * * * *